United States Patent [19]

Stevens et al.

[11] Patent Number: 5,763,320
[45] Date of Patent: Jun. 9, 1998

[54] BORON DOPING A SEMICONDUCTOR PARTICLE

[76] Inventors: Gary Don Stevens, 18912 Ravenglen Ct., Dallas, Tex. 75287; Jeffrey Scott Reynolds, 703 Horizon, Murphy, Tex. 75094; Louanne Kay Brown, 2530 Poplar Tr., Garland, Tex. 75042

[21] Appl. No.: 570,070

[22] Filed: Dec. 11, 1995

[51] Int. Cl.$^6$ .................................. H01L 21/22
[52] U.S. Cl. ............................ 438/563; 438/567
[58] Field of Search ...................... 437/160, 163, 437/164, 165, 166, 168, 169; 148/DIG. 34; 438/558, 560, 563, 566, 567, 568

[56] References Cited

U.S. PATENT DOCUMENTS

| | | | |
|---|---|---|---|
| 3,615,943 | 10/1971 | Genser | 437/164 |
| 3,630,793 | 12/1971 | Christensen et al. | 437/164 |
| 4,169,000 | 9/1979 | Riseman | 437/238 |
| 5,028,546 | 7/1991 | Hotchkiss | 437/2 |
| 5,135,887 | 8/1992 | Delage et al. | 437/165 |
| 5,432,127 | 7/1995 | Lamson et al. | 437/182 |
| 5,556,791 | 9/1996 | Stevens et al. | 437/4 |

OTHER PUBLICATIONS

Appl. 08/570,028 Filed Dec. 11, 1995 by Stevens et al.

*Primary Examiner*—Chandra Chaudhari
*Attorney, Agent, or Firm*—R. Craig Armstrong; Robert C. Klinger

[57] ABSTRACT

A method (10,30) of boron doping a semiconductor particle using boric acid to obtain a p-type doped particle. Either silicon spheres or silicon powder is mixed with a diluted solution of boric acid having a predetermined concentration. The spheres are dried (16), with the boron film then being driven (18) into the sphere. A melt procedure mixes the driven boron uniformly throughout the sphere. In the case of silicon powder, the powder is metered out (38) into piles and melted/fused (40) with an optical furnace. Both processes obtain a p-type doped silicon sphere with desired resistivity. Boric acid is not a restricted chemical, is inexpensive, and does not pose any special shipping, handling, or disposal requirements.

14 Claims, 1 Drawing Sheet

BORON DOPING A SEMICONDUCTOR PARTICLE

The Government of the United States of America has rights in this invention pursuant to Subcontract No. ZAI-4-11294-04 awarded by the U.S. Department of Energy.

CROSS REFERENCE TO RELATED APPLICATIONS

Cross reference is made to commonly assigned co-pending patent application Ser. No. 08/570,028, Attorney Docket No. TI-19663 entitled "Phosphorus Doping a Semiconductor Particle", filed Dec. 11, 1995 and the teachings incorporated herein by reference.

1. Technical Field of the Invention

The present invention is generally related to the manufacture of photovoltaic cells or solar cells, and more particularly to a method of doping a semiconductor particle such as a silicon sphere with boron.

2. Background of the Invention

Solar cells are photovoltaic devices which convert the sun's solar energy into useful electrical energy. These solar cells may comprise a matrix or array of doped semiconductor spheres embedded in a light-reflective aluminum foil, the semiconductor material typically comprising silicon. One such solar cell is disclosed in U.S. Pat. No. 5,028,546 to Hotchkiss, entitled "Method for Manufacture of Solar Cell with Foil Contact Point", assigned to the same assignee of the present invention, the teachings of this patent incorporated herein by reference. These solar cells typically are composed of a transparent matrix provided with spheroidal particles of silicon, each particle having a p-region exposed on one matrix surface, and an n-type region extending to an opposed matrix surface. Electrical energy is produced when photons of light strike the silicon sphere, inducing electrons to cross the depletion region between the two conductivity types.

To create the p-region in the silicon sphere, the spheres are doped, typically with boron. Several sources are available for doping these spheres with boron, however, many boron doping sources will create a boron rich glass (BRL) on the silicon surface following deposition. In addition, the prior art boron sources typically are restricted chemicals and require special shipping, handling, and disposal requirements. In addition, the cost of these boron sources is relatively expensive.

It is desired to fabricate a p-type semiconductor particle having a resistivity range which provides maximum solar conversion efficiency. The method for creating the doped semiconductor particle would preferably be derived from a dopant source that is not a restricted chemical nor pose any special shipping, handling or disposal requirements. The method should cost significantly less than other methods, and avoid creating BRL on the silicon surface following deposition.

SUMMARY OF THE INVENTION

The present invention achieves technical advantages by utilizing boric acid as a dopant source and diluting it with deionized water. Boric acid is a low cost commercially available product that is not a restricted chemical, nor does it pose any special shipping, handling or disposal requirements. No BRL is left on the silicon surface following deposition.

The present invention comprises the steps of first creating a diluted solution of boron dopant, preferably comprised of boric acid and deionized water. The chosen concentration of the solution depends on whether a sphere is first formed from silicon and immersed in the solution, or, if a predetermined quantity of silicon powder is mixed with a predetermined amount of the solution and then melted/fused to form a silicon sphere.

In the first instance, whereby already formed silicon spheres are mixed with the diluted solution, the spheres are subsequently dried, preferably by a tumbling procedure. This tumble dry procedure improves the uniformity of the doping film on the surface of the spheres. Next, the spheres are heated to an elevated temperature for a predetermined period of time to drive the boron beneath the surface of the sphere. A melt process is then used to release boron into the silicon bulk, creating a p-type silicon sphere. The spheres are remelted at least once to assure uniform boron distribution throughout the sphere and to obtain a sufficiently round p-doped sphere, prior to a subsequent n-type diffusion and packaging in a solar cell foil of the array. An HF cleaning process is normally used prior to each remelt procedure for cleanup to remove any oxide layers.

In the second instance, when silicon powder is mixed with a diluted solution of boric acid, a more diluted solution is utilized than that used for already formed spheres. This is due to surface availability and distribution differences between the granular powder and an already formed sphere. The mixture of silicon powder and diluted boric acid is allowed to air dry since capillary action maintains contact to the liquid throughout the bulk of powder. A drive step is not required since the powder will be rapidly fused, trapping the dopant in the resulting sphere. The doped powder is metered out into silicon piles, and then quickly melted/fused into spheres using an optical furnace according to the invention disclosed in commonly assigned co-pending patent application Ser. No. 08/368,229 now U.S. Pat. No. 5,556,791 entitled, "Optically fused Semiconductor Powder for Solar Cells", the teaching of which is incorporated herein by reference. More than one optical remelt may be required if necessary to get a sufficiently round sphere.

Spheres having a resistivity typically between 0.8 and 1.0 ohms/cm are obtainable utilizing either process. About 50 ppmw of $H_3BO_3$ is utilized for already formed spheres, whereby about 4 ppmw of $H_3BO_3$ is utilized for powder. The dilution process of boric acid can be obtained in one or several steps to obtain an appropriate concentration of the dopant in doped solution. Typically, about 20 ml of 0.01% $H_3BO_3$ in deionized water is added to 1 kilogram of fine silicon powder, whereas 5 ml of 1% $H_3BO_3$ is added to 1 kilogram of spheres to obtain wetting of all surfaces.

DETAIL DESCRIPTION OF THE PREFERRED EMBODIMENT

Figure 1:
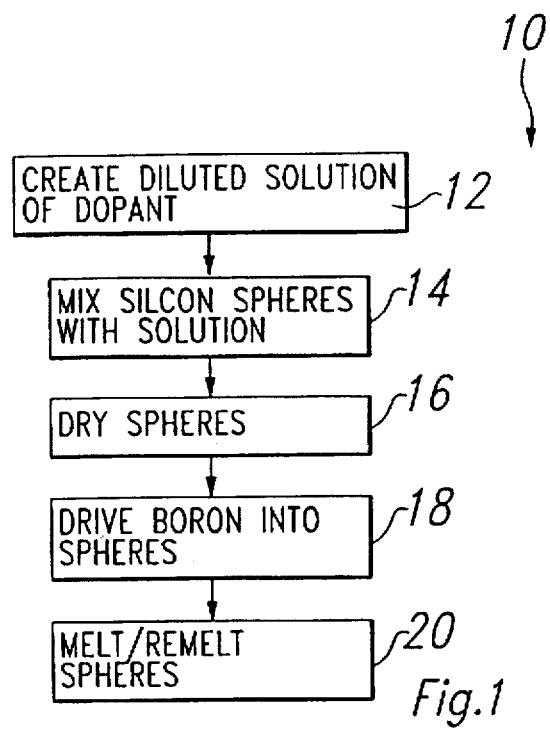
FIG. 1 is a flow diagram of one method for doping a semiconductor particle whereby an already formed silicon sphere is utilized as a baseline material.

Referring now to FIG. 1, there is generally shown at 10 a flow diagram of a first preferred embodiment of the present invention. This process is utilized to p-type dope an already formed silicon sphere, to create a sphere with a resistivity typically being between 0.8 and 1.0 ohms/cm.

At step 12, a diluted p-type dopant solution is created using off-the-shelf boric acid ($H_3BO_3$) and deionized water, to create a solution having about 1% concentration (10 grams/liter).

At step 14, a quantity of silicon spheres is mixed with the solution created in step 12. Preferably, 5 ml/kg is the desired ratio of solution to spheres, which corresponds to 0.05 grams of $H_3BO_3$ to each kilogram of silicon.

At step 16, the spheres are tumble dried. This tumble dry procedure is required for the spheres to improve the uniformity of the boron doping solution about the surface of the spheres.

At step 18, the boric acid coating on the sphere surface is driven into the sphere by placing the spheres in a conventional furnace at a temperature of 850° Celsius, having an ambient of $N_2$, for 30 minutes. This procedure drives the boron beneath the surface of the sphere, which is necessary due to the competition of oxide with silicon for the boron during melt. This results in a boron recovery of about 5% after melt. A more rapid melt process could be used to minimize the loss of the boron to oxide by minimizing oxide growth.

At step 20, the melt/remelt procedure is performed to obtain a sufficiently round sphere and to thoroughly diffuse the dopant throughout the p-type sphere for uniform resistivity. A separate dilute hydrofluoric acid (HF) cleaning procedure (5%) normally precedes each remelt.

Figure 2:
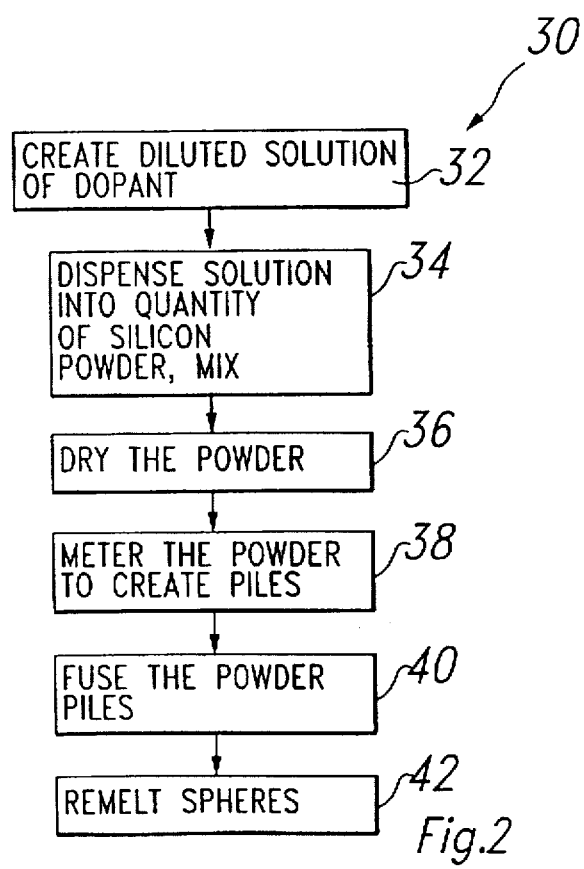
FIG. 2 is a method according to an alternative preferred embodiment of the present invention whereby powdered silicon is utilized as a starting material, is mixed with boric acid, and then the metered mixture is melted to form a silicon sphere using an optical furnace.

Referring now to FIG. 2, an alternative preferred embodiment to the present invention is generally shown at 30. In this embodiment, the starting material is powdered silicon feedstock which is preferably of semiconductor grade. At step 32, a diluted solution of dopant is created from boric acid, also using deionized water. The spheres have a typical diameter of 700 to 1,000 microns, while the grains of the powder have a particle size in the range of 50 to 300 microns. Therefore, due to the surface availability of the powder, a solution having a concentration of about 0.02% $H_3BO_3$ (0.2 grams/liter) is created. This solution is created by diluting a 0.2% concentration 10-fold, water whereby 2 milliliters of 0.2% solution is diluted with deionized water to form 20 milliliters of solution having a concentration of 0.02% $H_3BO_3$ (0.2 grams/liter).

At step 34, a small quantity of this diluted solution created from step 32 is dispensed into a predetermined quantity of silicon powder and thoroughly mixed. Preferably, 20 milliliters of the 0.02% diluted solution is provided for each kilogram of a silicon powder, to obtain approximately 0.004 grams of $H_3BO_3$ per kilogram of silicon.

At step 36, the powder is allowed to air dry, and no motion is required as the capillary action is sufficient to maintain wetting of all surfaces.

At step 38, the doped silicon powder is metered out to create piles, and at step 40, melted/fused to create a silicon sphere using an optical furnace, this procedure being disclosed in commonly assigned U.S. Pat. No. 5,432,127 entitled "Process for Producing Semiconductor Spheres", and in commonly assigned U.S. patent application Ser. No. 08/368,229 entitled "Optically Fused Semiconductor Powder for Solar Cells", the teaching of each incorporated herein by reference. No drive step is required since the powder will be rapidly fused, uniformly trapping the boron dopant in the resulting sphere. At step 42 the remelt procedure is performed to obtain a sufficiently round sphere.

Silicon spheres having a resistivity of between 0.8 to 1.0 ohms/cm are obtained using either process with a range of 0.6 to 2.0 ohm/cm. The spheres require a solution having 50 ppmw of $H_3BO_3$ as compared to 4 ppmw for the powder due the surface availability and distribution differences. The spheres require a drive process to get the $H_3BO_3$ beneath the surface of the sphere due to the competition of oxide with silicon for the boron during melt. The optical melt process minimizes loss of boron to oxide by minimizing oxide growth, resulting in boron recovery of greater than 30% for the optically melted powder versus less than 5% for the standard melt spheres. Again, the tumble dry procedure is required for spheres to improve the uniformity of surface coverage during the drying process, since the liquid tends to drain to the bottom of the sphere batch. The amount of free boron recovered into the silicon determines the resistivity of the silicon spheres.

One of the major advantages of boric acid over other boron doping sources is the absence of a boron rich glass (BRL) left on the silicon surface following deposition. The absence of the BRL eliminates the need for post deposition cleaning steps prior to the spheres being melted. Because boric acid is not a restricted chemical it does not pose any special shipping, handling, or disposal requirements. The cost of boric acid is significantly less than the cost of other commercial boron doping products, and is available off-the-shelf. The boric acid is easily diluted using deionized water, with a desired concentration being easily obtained.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, limitation to the selected concentrations of diluted boric acid or the time period and temperature of drive is not to be inferred.

We claim:

1. A method of doping a semiconductor particle, comprising the steps of:
    a) preparing a diluted solution including a compound containing boron;
    b) mixing the semiconductor particle with the solution to coat said particle with said boron compound;
    c) drying said particle;
    d) diffusing said boron coating into said particle; and
    e) Melting said particle to release boron into the bulk to form a uniformly p-doped said particle of desired resistivity.

2. The method as specified in claim 1 wherein said particle comprises a sphere.

3. The method as specified in claim 1 wherein said particle comprises silicon.

4. The method as specified in claim 1 wherein said compound comprises boric acid.

5. The method as specified in claim 1 wherein said compound is diluted in deionized water.

6. The method as specified in claim 5 wherein the concentration of said solution is about 10 grams/liter.

7. The method as specified in claim 1 comprising the step of diffusing said coating into said particle by heating said particle to a temperature of between approximately 800° C. and 900° C.

8. A method of forming a doped semiconductor particle, comprising the steps of:
    a) preparing a diluted solution including a compound containing boron;
    b) mixing a quantity of powdered semiconductor material with a predetermined quantity of said diluted solution; and c) heating said quantity of powdered semiconductor material to fuse said material and form a uniformly p-doped said particle of desired resistivity.

9. The method as specified in claim 8 wherein said solution has a concentration of about 2 grams/liter.

10. The method as specified in claim 8 wherein said compound comprises boric acid.

11. The method as specified in claim 8 wherein said compound is diluted with deionized water.

12. The method as specified in claim 8 wherein said semiconductor material comprises silicon.

13. The method as specified in claim 8 wherein said sphere has a diameter of approximately 30 mils.

14. The method as specified in claim 8 wherein said doped sphere has a resistivity of about 1 ohm/cm.

* * * * *